(12) United States Patent
Lin et al.

(10) Patent No.: US 7,948,414 B2
(45) Date of Patent: May 24, 2011

(54) DELTA-SIGMA ANALOG-TO-DIGITAL CONVERSION APPARATUS AND METHOD THEREOF

(75) Inventors: Tse-Chi Lin, Taipei County (TW); Yu-Hsuan Tu, Tainan (TW); Chang-Shun Liu, Taipei (TW); Kang-Wei Hsueh, Hsinchu (TW)

(73) Assignee: Mediatek, Inc., Science-Based Industrial Park, Hsin-Chu (TW)

( * ) Notice: Subject to any disclaimer, the term of this patent is extended or adjusted under 35 U.S.C. 154(b) by 10 days.

(21) Appl. No.: 12/538,153

(22) Filed: Aug. 9, 2009

(65) Prior Publication Data

US 2011/0032132 A1 Feb. 10, 2011

(51) Int. Cl.
*H03M 3/00* (2006.01)
(52) U.S. Cl. .................. 341/143; 341/120; 341/144
(58) Field of Classification Search ............. 341/143, 341/144, 155, 120, 118
See application file for complete search history.

(56) References Cited

U.S. PATENT DOCUMENTS

| | | | |
|---|---|---|---|
| 6,885,326 B2 * | 4/2005 | Zierhofer | 341/143 |
| 6,940,438 B2 * | 9/2005 | Koe et al. | 341/143 |
| 7,298,305 B2 | 11/2007 | Melanson | |
| 7,355,540 B2 * | 4/2008 | Kitahira | 341/143 |
| 7,656,330 B2 * | 2/2010 | O'Dowd et al. | 341/143 |
| 2010/0214142 A1 * | 8/2010 | Akizuki et al. | 341/143 |

* cited by examiner

*Primary Examiner* — Peguy JeanPierre
(74) *Attorney, Agent, or Firm* — Winston Hsu; Scott Margo

(57) ABSTRACT

A delta-sigma analog-to-digital conversion apparatus for receiving an analog input signal to generate a digital output signal includes a subtracting unit, a quantizer, and a feedback unit. The subtracting unit is utilized for performing a subtraction function to generate a subtracted signal according to the analog input signal and a feedback signal. The quantizer is coupled to the subtracting unit and utilized for performing quantization to generate a quantized signal according to the subtracted signal. The feedback unit is coupled between the subtracting unit and the quantizer, and utilized for providing the feedback signal to the subtracting unit according to the quantized signal. The subtracting unit is arranged to reduce signal input swing of the quantizer.

14 Claims, 4 Drawing Sheets

DELTA-SIGMA ANALOG-TO-DIGITAL CONVERSION APPARATUS AND METHOD THEREOF

BACKGROUND

The present invention relates to an analog-to-digital conversion (ADC) scheme, and more particularly to a delta-sigma analog-to-digital conversion apparatus, and a method thereof.

A conventional ADC device with continuous-time delta sigma modulation (CTDSM) usually includes a quantizer. The quantizer is usually implemented using a flash analog-to-digital converter, i.e. an analog-to-digital converter having high speed signal processing. It is required to use more comparators to implement the flash analog-to-digital converter if the flash analog-to-digital converter includes multi-bit outputs. A significantly large number of comparators will introduce more costs to the conventional ADC device. In addition, a digital-to-analog converter conventionally used for directly feeding back a feedback signal from the output terminal of the quantizer into the input terminal of the quantizer may not achieve system stability and has large bandwidth/high operating speed limitations. Both these issues cause serious problems.

SUMMARY

It is therefore one objective of the present invention to provide a delta-sigma ADC apparatus and related method for achieving reduction of signal input swing of a quantizer and/or reduction of signal input swing of a digital-to-analog converter, to solve the above-mentioned problems. By reducing the signal input swing of the quantizer, the comparator number or the comparison number of the quantizer can be significantly decreased when the quantizer respectively includes, for example, a flash ADC or a successive approximation (SAR) ADC. By reducing the signal input swing of the DAC, the operating speed of the DAC can be decreased, making the implementation easier.

According to an embodiment of the claimed invention, a delta-sigma analog-to-digital conversion (DSADC) apparatus for receiving an analog input signal to generate a digital output signal is disclosed. The DSADC apparatus comprises a subtracting unit, a quantizer, and a feedback unit. The subtracting unit is utilized for performing a subtraction function to generate a subtracted signal according to the analog input signal and a feedback signal. The quantizer is coupled to the subtracting unit and utilized for performing quantization to generate a quantized signal according to the subtracted signal. The feedback unit is coupled between the subtracting unit and the quantizer, and utilized for providing the feedback signal to the subtracting unit according to the quantized signal. The subtracting unit is arranged to reduce signal input swing of the quantizer.

According to another embodiment of the claimed invention, a delta-sigma analog-to-digital conversion (DSADC) method for receiving an analog input signal to generate a digital output signal is disclosed. The DSADC method comprises: performing a signal subtraction function to generate a subtracted signal according to the analog input signal and a feedback signal; performing a quantization function to generate a quantized signal according to the subtracted signal; and performing a conversion function according to the quantized signal to provide the feedback signal for the signal subtraction function, wherein the signal subtraction function is arranged to reduce swing of the subtracted signal.

According to an embodiment of the claimed invention, a delta-sigma analog-to-digital conversion (DSADC) apparatus for receiving an analog input signal to generate a digital output signal is disclosed. The DSADC apparatus comprises a subtracting unit, a quantizer, a digital computation unit, and a feedback unit. The subtracting unit is utilized for performing a subtraction function to generate a subtracted signal according to the analog input signal and a feedback signal. The quantizer is coupled to the subtracting unit and utilized for performing quantization to generate a quantized signal according to the subtracted signal. The digital computation unit is coupled to the quantizer and utilized for receiving the quantized signal and performing digital computation to generate a specific signal having a signal range smaller than that of the quantized signal. The feedback unit is coupled to the digital computation unit and subtracting unit, and used for providing the feedback signal to the subtracting unit according to the specific signal generated by the digital computation unit, wherein signal input swing of the feedback unit is reduced due to the specific signal generated by the digital computation unit.

According to another embodiment of the claimed invention, a delta-sigma analog-to-digital conversion (DSADC) method for receiving an analog input signal to generate a digital output signal is disclosed. The DSADC method comprises: performing a subtraction function to generate a subtracted signal according to the analog input signal and a feedback signal; performing quantization to generate a quantized signal according to the subtracted signal; performing digital computation according to the quantized signal to generate a specific signal having a signal range smaller than that of the quantized signal; and providing the feedback signal for the subtracting function according to the specific signal generated by the digital computation.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
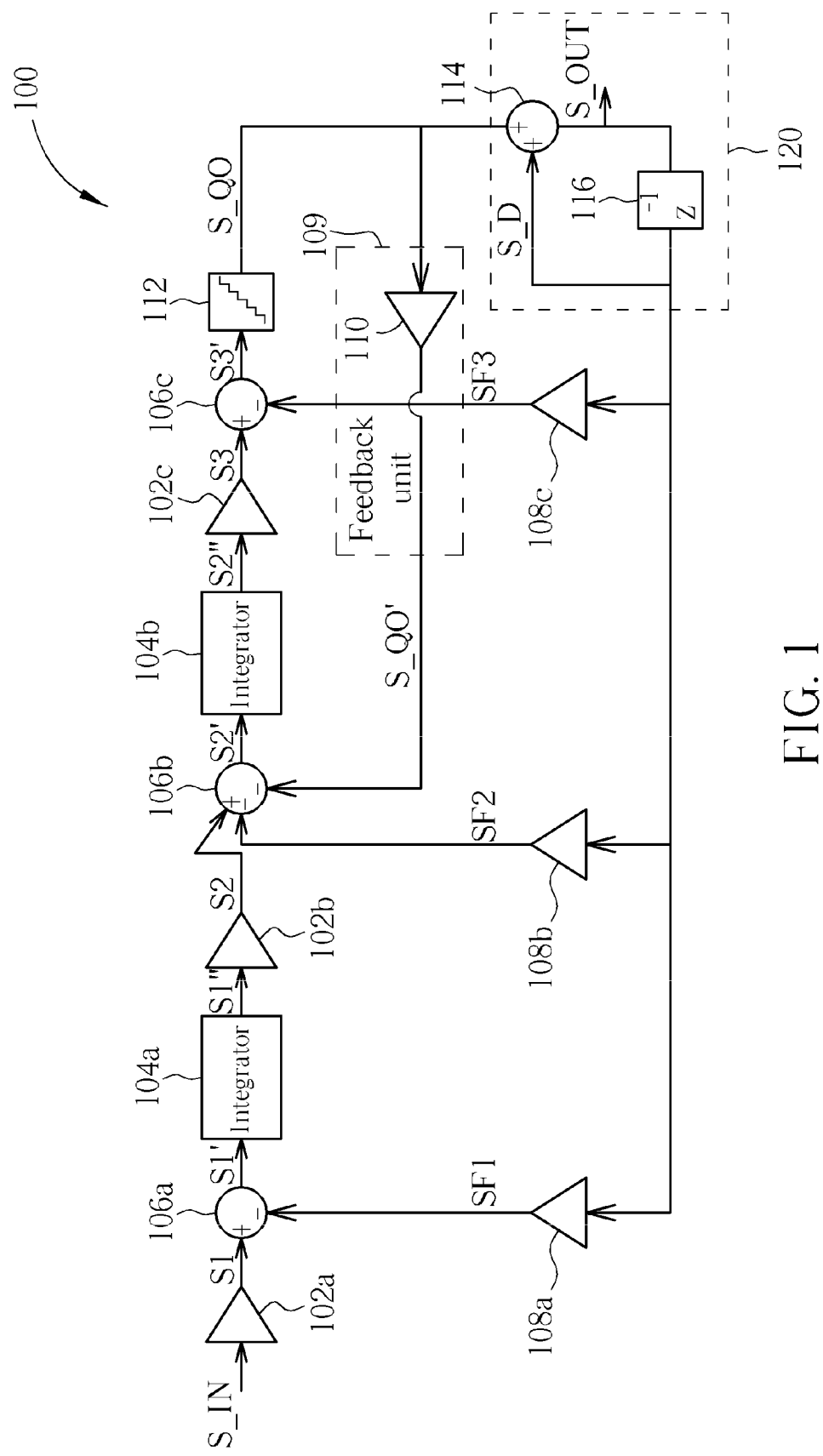
FIG. 1 is a diagram of a delta sigma analog-to-digital conversion (DSADC) apparatus according to a first embodiment of the present invention.

Please refer to FIG. 1. FIG. 1 is a diagram of an analog-to-digital conversion (ADC) apparatus 100 according to a first embodiment of the present invention. The ADC apparatus 100 is, in this embodiment, a second-order multi-bit quantizer continuous-time delta sigma modulator (i.e. operable in a continuous-domain) and is used for receiving an analog input signal S_IN to generate a digital output signal S_OUT; however, this is not meant to be a limitation of the present invention. The ADC apparatus 100 can be modified to be a first-order continuous-time delta sigma modulator or other modulators of n-th order. In general, the ADC apparatus of the present invention can be implemented to modulators or converters with over-sampling mechanism. Through the processing of the ADC apparatus 100, the analog input signal S_IN can be processed by over-sampling and noise-shaping techniques, and signal-to-noise ratio (SNR) is thereby improved. Specifically, as shown in FIG. 1, the ADC apparatus 100 comprises three gain amplifiers 102a-102c, two integrators 104a and 104b, three adders 106a-106c, three digital-to-analog converters (DAC) 108a-108c placed on feedback paths, a feedback unit 109 comprising a specific DAC 110 used for reducing signal swing (i.e. signal dynamic range), a quantizer 112 (e.g. an ADC), and a transfer function compensation unit 120. The gain amplifiers 102a-102c are used for signal amplification with corresponding gain values thereof, and the adders 106a-106c are used as signal subtracting units for respectively performing subtraction functions upon analog signals S1-S3 to generate subtracted signals S1'-S3' according to the analog input signal Sin and corresponding feedback signals SF1-SF3. The integrators 104a and 104b are used for performing signal integration to generate integrated signals S1" and S2" according to the subtracted signals S1' and S2', respectively. In detail, the integrator 104a is disposed between the adder 106a and the gain amplifier 102b, and the integrator 104b is disposed between the adder 106b and the quantizer 112. The integrators 104a and 104b directly receive the subtracted signals S1' and S2' and respectively perform signal integration upon the subtracted signals S1' and S2' to generate the integrated signals S1" and S2". In addition, the quantizer 112 includes an input node for receiving the subtracted signal S3' generated from the adder 106c and an output node for outputting a quantized signal S_QO. Since the functions and operations of the gain amplifiers 102a-102c, integrators 104a-104b, adders 106a-106c, DACs 108a-108c, and quantizer 112 of the delta sigma modulation are well-known to those skilled in the art, further description is not detailed here. It should be noted that the numbers and configurations of the adders, gain amplifiers, integrators and DACs shown in FIG. 1 are for illustrative purpose only and may have different configurations as the ADC apparatus 100 may be implemented with different orders.

In practice, the quantizer 112 is a multi-bit quantizer. That is to say, the number of quantization levels of the quantizer 112 is more than two, and the outputted quantized signal S_QO is a digital signal having more than one bit. In order to achieve high speed signal processing, a multi-bit quantizer may be implemented using a flash ADC. However, a conventional flash ADC having multi-bit outputs, which is implemented by a conventional scheme, by necessity includes a large number of comparators. For example, if a conventional flash ADC has four-bit outputs (i.e. includes sixteen quantization levels), then fifteen comparators are needed. Such a large number of comparators will introduce more costs. Therefore, the circuits and configuration of this embodiment are developed so as to reduce the number of needed comparators within the quantizer 112.

In this embodiment, the design of the feedback unit 109 effectively reduces the number of comparators used for implementing the quantizer 112 by reducing the input signal swing of the quantizer 112 (i.e. the maximum signal range of a signal received by the quantizer 112) so that the number of quantization levels of the quantizer 112 can be decreased. In one embodiment, the feedback unit 109 comprises the specific DAC 110 utilized for directly receiving the quantized signal S_QO generated by the quantizer 112, converting the quantized signal S_QO from digital format into a converted analog signal S_QO' having analog format, and transmitting the converted analog signal S_QO' into a circuit element placed before the quantizer 112. For instance, the specific DAC 110 is arranged to feed back the quantized signal S_QO into the adder 106b; the converted analog signal S_QO' outputted by the specific DAC 110 can be viewed as a feedback signal. Through feeding back the quantized signal S_QO into a front stage circuit such as the adder 106b, and subtracting the quantized signal S_QO from a signal such as the analog signal S2 prior to the quantization, the signal swing (i.e. the signal dynamic range) of the quantizer 112 is decreased significantly. The input signal of the quantizer 112 can be equivalently viewed as the difference between an analog input signal at a present time instance t(n) and an analog output signal of the quantizer 112 at a preceding time instance t(n−1). That is, the input of the quantizer 112 in this embodiment can be regarded as a quantization error signal. This is how the quantization levels of the quantizer 112 can be decreased. The quantized signal S_QO is then received by the transfer function compensation unit 120, and the transfer function compensation unit 120 is used for generating the digital output signal S_OUT according to the quantized signal S_QO. In addition, the transfer function compensation unit 120 is utilized for compensating the transfer function variation caused by the specific DAC 110, i.e. compensating the transfer function variation generated by subtracting the feedback signal S_QO' from the analog input signal S_IN. In this embodiment, the transfer function compensation unit 120 includes a digital adder 114 and a delay unit 116. The digital adder 114 sums the quantized signal S_QO and a delayed quantized signal S_D which is generated by the delay unit 116 so as to generate the digital output signal S_OUT. The delay unit 116 is utilized for performing integer delay. More particularly, the delay unit 116 is utilized for delaying the output signal S_OUT generated from the digital adder 114 by one time-slot to generate the delayed quantized signal S_D. The digital adder 114 is arranged to sum the quantized signal S_QO and the delayed quantized signal S_D so as to generate the digital output signal S_OUT. That is, the digital adder 114 can be equivalently regarded as being used for summing a current value of the quantized signal S_QO and a former value of the quantized signal S_QO to generate the digital output signal S_OUT. In this way, the subtracted part resulting from the specific DAC 110 and the adder 106b is added back to the quantized signal S_QO in digital domain. The digital output signal S_OUT is transmitted to a next stage circuit such as a digital filter (not shown in FIG. 1); however, this is not intended to be a limitation of the present invention. It should be noted that the specific DAC 110 may be coupled to other stage circuits different from the adder 106b; for example, the specific DAC 110 may feed the converted analog signal S_QO' to the adder 106a or 106c, and the adder 106a or 106c may subtract the converted analog signal S_QO' from the analog signal S1 or S3 to reduce the signal swing of the quantizer 112. The way of generating the digital output signal S_OUT, i.e. the design of the transfer function compensation unit 120, however, may depend upon the arrangement of the feedback unit 109. When the feedback unit 109 is coupled to another front stage circuit different from the adder 106b, the design of the transfer function compensation unit 120 may be altered in order to compensate the transfer function variation caused by that specific arrangement. These modifications all obey the spirit of the present invention.

Please note that an objective of the operation of the specific DAC 110 is different from that of the DACs 108a-108c; the specific DAC 110 is to reduce the signal swing of the quantizer 112 while the DACs 108a-108c are used for transmitting feedback signals to the corresponding adders for achieving system stability. In short, by using the specific DAC 110, the quantizer 112 still has precise outputs even though fewer comparators, less area and less power consumption are used. Similarly, when the quantizer 112 uses a successive approximation ADC (SARADC) rather than a flash ADC, the comparison number taken by the SARADC can be significantly reduced as the input signal swing of the quantizer 112 is reduced. In return, the power consumption and operating speed of the quantizer 112 can be improved. It should be noted that the system response of the ADC apparatus 100 is still stable since the transfer curve of the system response is not altered.

Figure 2:
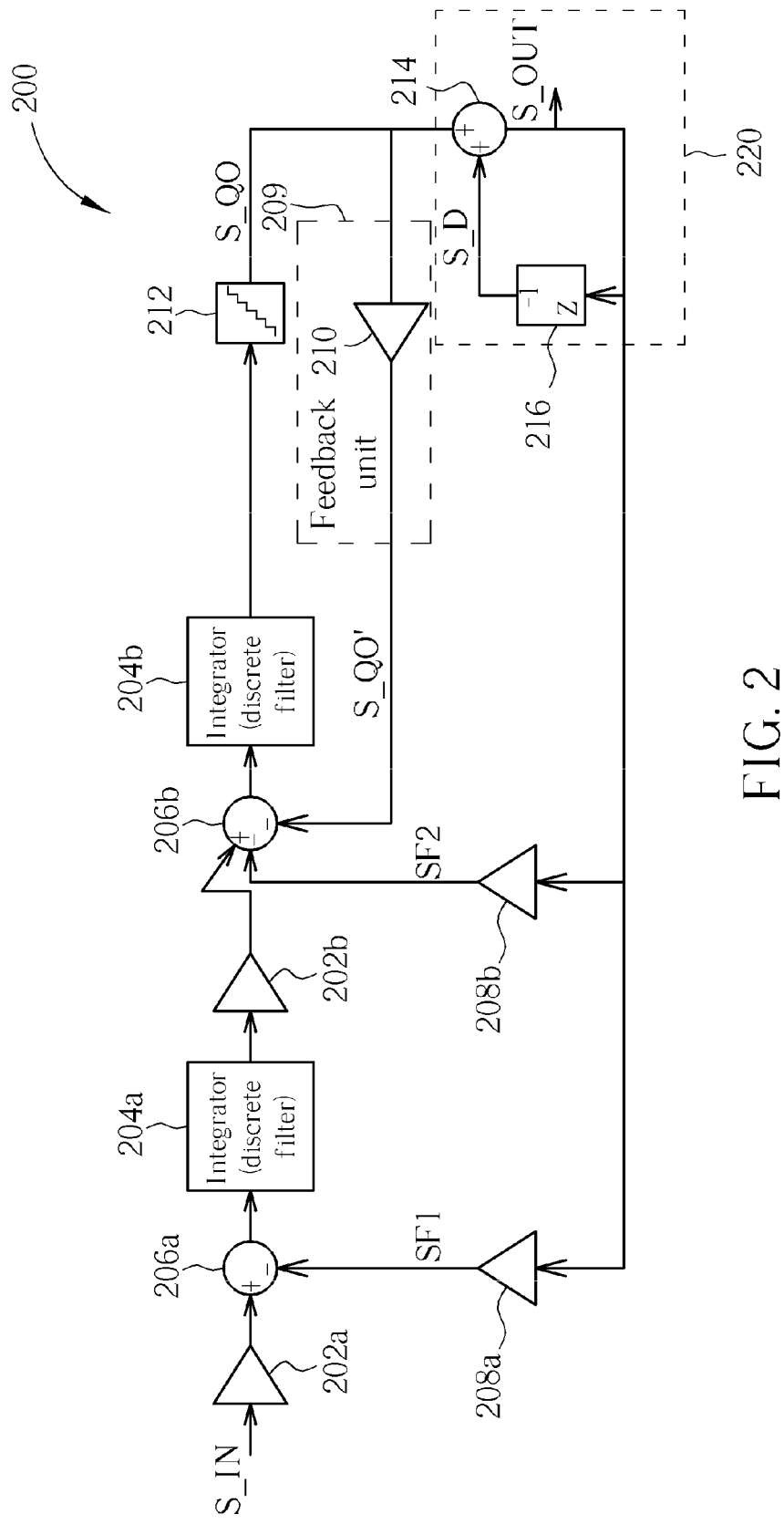
FIG. 2 is a diagram of a DSADC apparatus according to a second embodiment of the present invention.

An ADC apparatus that includes a DAC of a similar design as the specific DAC 110 can be used for receiving and processing a discrete time analog signal. Please refer to FIG. 2. FIG. 2 is a diagram of an ADC apparatus 200 according to a second embodiment of the present invention. The ADC apparatus 200 is a second-order multi-bit quantizer discrete-time delta sigma modulator (i.e. operable in a discrete-domain). The ADC apparatus 200 comprises two gain amplifiers 202a-202b, two discrete integrators 204a and 204b, two adders 206a-206b, two digital-to-analog converters (DAC) 208a-208b placed on feedback paths, a feedback unit 209 having specific DAC 210 used for reducing signal swing (i.e. signal dynamic range), a quantizer 212 (e.g. a flash ADC), and a transfer function compensation unit 220 including a digital adder 214 and a delay unit 216 in this embodiment. A difference is that the ADC apparatus 200 receives and processes a discrete time analog signal while the ADC apparatus 100 in the first embodiment receives and processes a continuous time analog signal. Since the operation and function of the circuit elements included within the ADC apparatus 200 are clearly described in the above description, further illustration is not detailed again.

Figure 3:
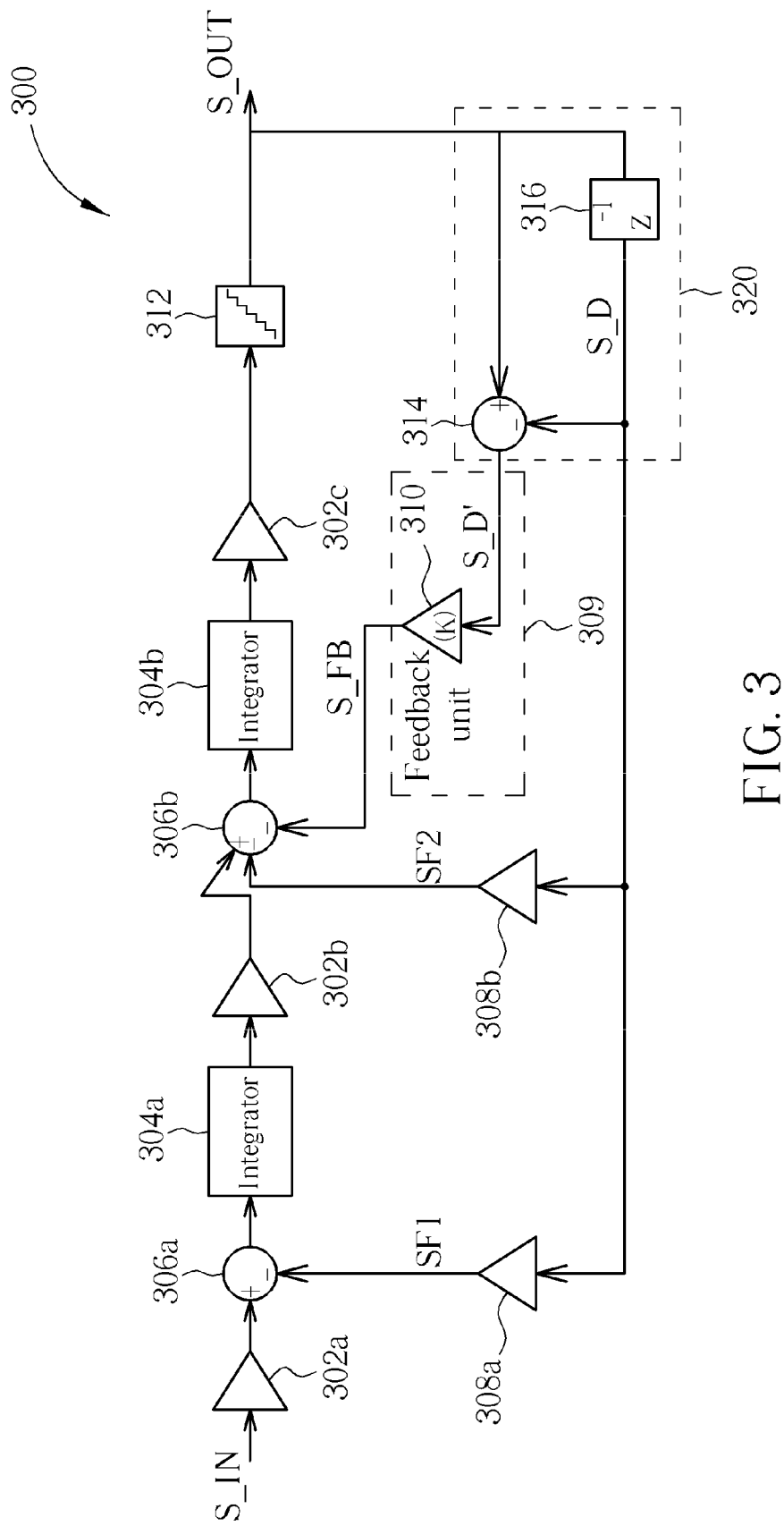
FIG. 3 is a diagram of a DSADC apparatus according to a third embodiment of the present invention.

Please refer to FIG. 3. FIG. 3 is a diagram of an ADC apparatus 300 according to a third embodiment of the present invention. The ADC apparatus 300 is a second-order multi-bit quantizer continuous-time delta sigma modulator. As shown in FIG. 3, the ADC apparatus 300 comprises three gain amplifiers 302a-302c, two integrators 304a and 304b, two analog adders 306a-306b, two digital-to-analog converters (DAC) 308a-308b placed on feedback paths, a feedback unit 309 comprising a specific DAC 310 for compensating stability of the ADC apparatus 300 with reduced input signal swing (i.e. signal dynamic range), a quantizer 312 (e.g. a flash ADC), and a digital computation unit 320 for reducing the input signal swing for the specific DAC 310 and compensating stability. In this embodiment, the digital computation unit 320 includes a digital adder 314 and a delay unit 316. The operations and functions of the gain amplifiers 302a-302c, integrators 304a and 304b, analog adders 306a-306b, digital-to-analog converters (DAC) 308a-308b, quantizer 312 included within the ADC apparatus 300 are similar to those of corresponding circuit elements included within the ADC apparatus 100, and further description is therefore not detailed for simplicity. Compared to the ADC apparatus 100, the ADC apparatus 300 utilizes the specific DAC 310 to substantially achieve the function of the DAC 108c shown in FIG. 1 with a plurality of additional advantages such as narrower bandwidth/lower operating speed requirements. This is accomplished by using the digital computation unit 320 and integrator 304b, wherein the digital computation unit 320 can reduce input signal swing of the specific DAC 310 (i.e. reducing the swing of a signal to be processed by the digital-to-analog conversion function) and the integrator 304b can replenish the reduced signal component before quantization. More specifically, as the ADC apparatus 100 directly feeds back the feedback signal SF3 to the input of the quantizer 112, the DAC 108c may require large bandwidth (i.e. higher signal processing speed) in this scheme and it is not easy to satisfy this requirement. On the other hand, the specific DAC 310 of this embodiment is arranged to feed the feedback signal S_FB into the adder 306b before the integrator 304b. Due to the narrower bandwidth of the integrator 304b (i.e. a lower signal processing speed), the signal processing speed of the specific DAC 310 could be lower than that of the DAC 108c, making the implementation more easily.

The number of quantization levels of the specific DAC 310 can be decreased. In this embodiment, in addition to generating a quantized signal as the digital output signal S_OUT, the quantizer 312 also outputs the quantized signal to the delay unit 316. The delay unit 316 is utilized for delaying the quantized signal outputted by the quantizer 312 to generate a delayed quantized signal S_D. Such a delayed quantized signal S_D is used by the DACs 308a and 308b to generate feedback signals into the corresponding analog adders 306a and 308b, respectively. In addition, the digital adder 314 coupled to the delay unit 316 and the specific DAC 310 is used as a subtracting unit for subtracting the delayed quantized signal S_D from the quantized signal of the quantizer 312 so as to generate a difference signal S_D'. Therefore, the difference signal S_D' inputted into the specific DAC 310 can represent a difference between a current value of the quantized signal of the quantizer 312 and a former value of the quantized signal. The specific DAC 310 then generates a feedback signal S_FB into the analog adder 306b according to the difference signal S_D' with reduced signal swing, and the analog adder 306b (used as a subtracting unit) subtracts the feedback signal S_FB from the analog input signal.

It should be noted that the system response of the ADC apparatus 300 is still stable since the transfer curve of such a system response is not altered. Additionally, the specific DAC 310 is further used for amplifying the difference signal S_D' with a specific gain value K, where the specific gain value K is determined by referring to the gain value of the gain amplifier 302c. In addition to the conversion function and the amplifying function, the feedback unit 309 may provide other processes on the difference signal S_D'.

Figure 4:
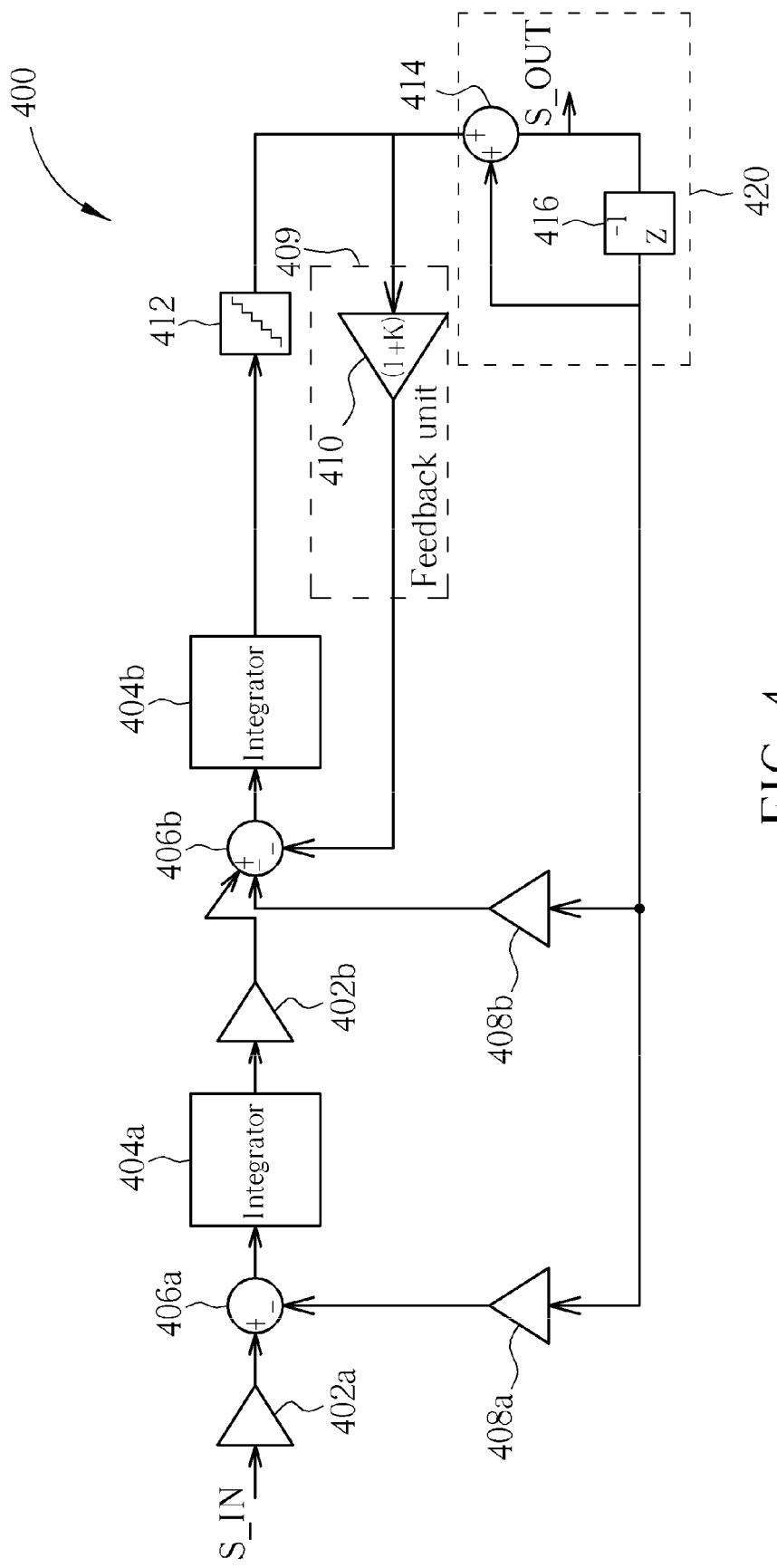
FIG. 4 is a diagram of a DSADC apparatus according to a fourth embodiment of the present invention.

Moreover, in another embodiment, the functions and operations of reducing the signal swing of a quantizer and reducing the signal swing of a DAC such as the DAC 310 shown in FIG. 3 can be integrated. Please refer to FIG. 4. FIG. 4 is a diagram of an ADC apparatus 400 according to a fourth embodiment of the present invention. The ADC apparatus 400 is a second-order multi-bit quantizer continuous-time delta sigma modulator. The ADC apparatus 400 comprises two gain amplifiers 402a-402b, two integrators 404a and 404b, two analog adders 406a-406b, two digital-to-analog converters (DAC) 408a-408b placed on feedback paths, a quantizer 412 (e.g. a flash ADC), a feedback unit 409 comprising a specific DAC 410 used for achieving system stability and reduction of signal swing (i.e. signal dynamic range) of the quantizer 412, and a transfer function compensation unit 420 including a digital adder 414 and a delay unit 416 in this embodiment. The circuit configuration and connection of the above-identified circuit elements are illustrated in FIG. 4, and further description is not detailed for brevity. The functions of reducing the quantization levels of the quantizer 412 and reducing the signal swing of the specific DAC 410 are merged in this embodiment with the specific DAC 410 having a gain value (1+K). Since the operations of reducing quantization levels of a quantizer and reducing signal swing of a DAC are illustrated in the foregoing paragraphs, additional description is not detailed again.

Those skilled in the art will readily observe that numerous modifications and alterations of the device and method may be made while retaining the teachings of the invention.

What is claimed is:

1. A delta-sigma analog-to-digital conversion (DSADC) apparatus for receiving an analog input signal to generate a digital output signal, comprising:
   a subtracting unit, for performing a subtraction function to generate a subtracted signal according to the analog input signal and a feedback signal;
   a quantizer, coupled to the subtracting unit, for performing quantization to generate a quantized signal according to the subtracted signal;
   a feedback unit, coupled between the subtracting unit and the quantizer, for providing the feedback signal to the subtracting unit according to the quantized signal; and
   a transfer function compensation unit, coupled to the quantizer, for generating the digital output signal according to the quantized signal, the transfer function compensation unit compensates the quantized signal for a transfer function variation generated by subtracting the feedback signal from the analog input signal to generate the digital output signal, and the transfer function compensation unit comprises:
      an adder, coupled to an output of the quantizer, for summing the quantized signal and a delayed signal to generate the digital output signal; and
      a delay unit, coupled to the adder, for delaying the digital output signal to generate the delayed signal;
   wherein the subtracting unit is arranged to reduce signal input swing of the quantizer.

2. The DSADC apparatus of claim 1, further comprising:
   an integrator having an input coupled to the subtracting unit and an output coupled to the quantizer, for performing integration on the subtracted signal to generate an integrated signal;
   wherein the quantizer performs the quantization on the integrated signal to generate the quantized signal.

3. The DSADC apparatus of claim 1, wherein the feedback unit comprises a digital-to-analog converter (DAC), and the DAC directly receives the quantized signal generated from the quantizer to generate the feedback signal.

4. The DSADC apparatus of claim 1, wherein the subtracting unit subtracts the feedback signal from the analog input signal, thereby reducing signal input swing of the quantizer and signal input swing of the feedback unit.

5. A delta-sigma analog-to-digital conversion (DSADC) method for receiving an analog input signal to generate a digital output signal, comprising:
   performing a signal subtraction function to generate a subtracted signal according to the analog input signal and a feedback signal;
   performing signal integration on the subtracted signal to generate an integrated signal;
   performing a quantization function to generate a quantized signal according to the integrated signal;
   performing a conversion function according to the quantized signal to provide the feedback signal for the signal subtraction function; and
   compensating the quantized signal for a transfer function variation generated by subtracting the feedback signal from the analog input signal to generate the digital output signal, and the step of compensating the quantized signal comprises:
      summing the quantized signal and a delayed signal to generate the digital output signal; and
      delaying the digital output signal to generate the delayed signal;
   wherein the signal subtraction function is arranged to reduce swing of the subtracted signal.

6. The DSADC method of claim 5, wherein the step of performing the conversion function according to the quantized signal to provide the feedback signal comprises:
   performing a digital-to-analog conversion (DAC) function upon the quantized signal to generate the feedback signal.

7. The DSADC method of claim 5, wherein the signal subtraction function is arranged to subtract the feedback signal from the analog input signal, thereby reducing the swing of the subtracted signal and the swing of a signal to be processed by the conversion function.

8. A delta-sigma analog-to-digital conversion (DSADC) apparatus for receiving an analog input signal to generate a digital output signal, comprising:
   a subtracting unit, for performing a subtraction function to generate a subtracted signal according to the analog input signal and a feedback signal;
   a quantizer, coupled to the subtracting unit, for performing quantization to generate a quantized signal according to the subtracted signal;
   a digital computation unit, coupled to the quantizer, for receiving the quantized signal and performing digital computation to generate a specific signal having a signal range smaller than that of the quantized signal; and
   a feedback unit, coupled to the digital computation unit and the subtracting unit, for providing the feedback signal to the subtracting unit according to the specific signal generated by the digital computation unit.

9. The DSADC apparatus of claim 5, wherein signal input swing of the feedback unit is reduced due to the specific signal generated by the digital computation unit.

10. The DSADC apparatus of claim 8, further comprising an integrator coupled to the subtracting unit, for performing integration upon the subtracted signal to generate an integrated signal, and the quantizer performs the quantization on the integrated signal to generate the quantized signal.

11. The DSADC apparatus of claim 8, wherein the feedback unit comprises a specific digital-to-analog converter (DAC), and the specific DAC with the reduced signal input swing thereof is arranged to compensate stability of the DSADC apparatus.

12. The DSADC apparatus of claim 8, wherein the digital computation unit comprises:
   a delay unit, for receiving the quantized signal and delaying the quantized signal to generate a delayed signal; and
   a subtracting unit, coupled to the delay unit, for subtracting the delayed signal from the quantized signal to generate a difference signal used as the specific signal having the signal range lower than that of the quantized signal.

13. A delta-sigma analog-to-digital conversion (DSADC) method for receiving an analog input signal to generate a digital output signal, comprising:

performing a subtraction function to generate a subtracted signal according to the analog input signal and a feedback signal;

performing quantization to generate a quantized signal according to the subtracted signal;

performing digital computation on the quantized signal to generate a specific signal having a signal range lower than that of the quantized signal; and providing the feedback signal for the subtracting function according to the specific signal generated by the digital computation.

14. The DSADC method of claim 13, wherein the step of performing digital computation to generate the specific signal comprises:

receiving the quantized signal and delaying the quantized signal to generate a delayed signal; and; and performing a subtraction function to subtract the delayed signal from the quantized signal to generate a difference signal used as the specific signal.

\* \* \* \* \*